(12) United States Patent
Mei (10) Patent No.: US 9,209,511 B2
(45) Date of Patent: Dec. 8, 2015

(54) DOHERTY POWER AMPLIFIER NETWORK

(71) Applicant: Anaren, Inc., East Syracuse, NY (US)

(72) Inventor: Chong Mei, Jamesville, NY (US)

(73) Assignee: Anaren, Inc., East Syracuse, NY (US)

( * ) Notice: Subject to any disclaimer, the term of this patent is extended or adjusted under 35 U.S.C. 154(b) by 340 days.

(21) Appl. No.: 13/652,042

(22) Filed: Oct. 15, 2012

(65) Prior Publication Data

US 2013/0093534 A1    Apr. 18, 2013

Related U.S. Application Data

(60) Provisional application No. 61/547,277, filed on Oct. 14, 2011, provisional application No. 61/569,827, filed on Dec. 13, 2011.

(51) Int. Cl.
| | |
|---|---|
| *H01P 5/12* | (2006.01) |
| *H03F 3/68* | (2006.01) |
| *H03F 1/02* | (2006.01) |
| *H03F 1/56* | (2006.01) |
| *H03F 3/60* | (2006.01) |

(52) U.S. Cl.
CPC ............... *H01P 5/12* (2013.01); *H03F 1/0288* (2013.01); *H03F 1/56* (2013.01); *H03F 3/602* (2013.01); *H03F 2200/387* (2013.01)

(58) Field of Classification Search
CPC ........... H03H 7/48; H03F 1/0288; H03F 3/68; H03F 3/211; H03F 1/56; H03F 1/95; H03F 3/602; H03F 2200/387; H01P 5/12

USPC ............................... 330/295, 124 R; 333/125
See application file for complete search history.

(56) References Cited

U.S. PATENT DOCUMENTS

| | | | |
|---|---|---|---|
| 2,210,028 A | 8/1940 | Doherty | |
| 5,420,541 A | 5/1995 | Upton et al. | |
| 5,568,086 A | 10/1996 | Schuss et al. | |
| 6,262,629 B1 | 7/2001 | Stengel et al. | |
| 7,521,995 B1 | 4/2009 | Krvavac | |
| 7,688,135 B2 * | 3/2010 | Kim et al. | ................. 330/124 R |
| 2012/0154034 A1 * | 6/2012 | Kato et al. | ................. 330/124 R |
| 2014/0152389 A1 * | 6/2014 | Hamparian | ................... 330/295 |

* cited by examiner

*Primary Examiner* — Robert Pascal
*Assistant Examiner* — Kimberly Glenn
(74) *Attorney, Agent, or Firm* — Daniel P. Malley; Bond Schoeneck & King, PLLC (57) ABSTRACT

The present invention is directed to a network that includes an output matching network coupled to an amplifier. The output matching network is configured to transform the at least one amplifier transistor output impedance to an output matching network impedance. A combiner network is coupled to the output matching network. The combiner network includes a first quarter wavelength transmission line coupled between the in-phase signal path and a combiner node. The combiner network further includes a bandwidth enhancement element coupled to the quadrature signal path at the combiner node and an impedance transformation element coupled between the combiner node and a load. The impedance transformation element is configured to substantially transform a combined output matching network impedance at the combiner node to the load impedance.

34 Claims, 8 Drawing Sheets

FIG. 3A (HIGH POWER)

FIG. 3B (LOW POWER)

DOHERTY POWER AMPLIFIER NETWORK

CROSS-REFERENCE TO RELATED APPLICATIONS

This is application is related to U.S. Provisional Patent Application Ser. No. 61/547,277 filed on Oct. 14, 2011, and U.S. Provisional Patent Application Ser. No. 61/569,827 filed on Dec. 13, 2011, the contents of which is relied upon and incorporated herein by reference in their entirety, and the benefit of priority under 35 U.S.C. §119(e) is hereby claimed.

BACKGROUND OF THE INVENTION

1. Field of the Invention

The present invention relates generally to power amplifiers, and particularly to Doherty power amplifiers.

2. Technical Background

One of the biggest challenges facing cellular base station power amplifier manufacturers is the task of increasing the efficiency of linear power amplifiers for high peak-to-average ratio (PAR) signals in a linear power amplifier. At same time, the competition on a global scale has created a requirement for base stations to support a wider range of frequency bands, as new spectrum is released worldwide to meet urgent capacity demands. Once the above stated challenge of providing a wideband power amplifier design is accomplished, designers can then focus on developing generic platforms that can be deployed in a number of different products with minimal or no change. Stated differently, a solution to the above stated problem reduces the number of design variants and this, in turn, provides the added benefit of faster design cycles and lower development costs.

In one approach that has been considered, Doherty power amplifiers have been widely adopted as a linear amplifier configuration with improved efficiency for high PAR signals. A Doherty power amplifier architecture includes two amplifiers. The input signal is directed into a device, such as a hybrid coupler, that provides in-phase and quadrature components of the input signal. Stated differently, the hybrid coupler splits the input signal into two equal halves, with the quadrature component being 90° out of phase with respect to the in-phase component. The first amplifier is referred to as the carrier amplifier or main amplifier (as it is referred to in all of the drawings) and it amplifies the in-phase component. The second amplifier is known as the peak amplifier (or peaking amplifier) and it is configured to amplify the quadrature component of the input signal. The carrier amplifier is typically implemented as a Class B amplifier that operates over approximately 180° of an input signal's sinusoidal period. The peak amplifier, on the other hand, is implemented as a Class C amplifier that is biased to operate in only a portion of the operating region of the carrier amplifier. Thus, only the carrier amplifier is operating when the input signal power is relatively low; and the output impedance of the peak amplifier is very high (e.g., 1000 Ohms).

Figure 1A:
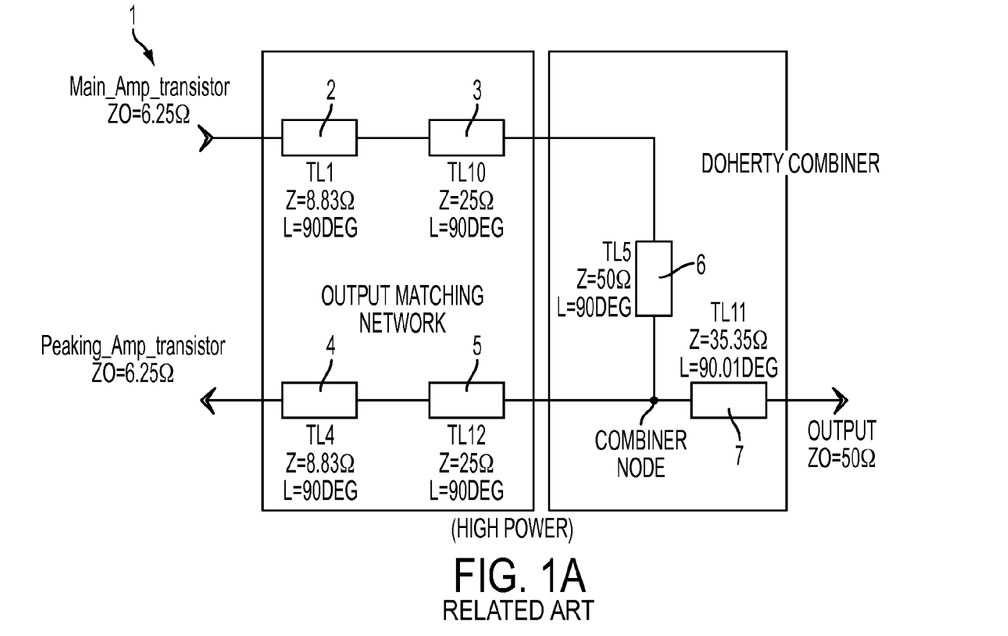
FIGS. 1A and 1B are schematic diagrams of a related art Doherty architecture.
Figure 1B:
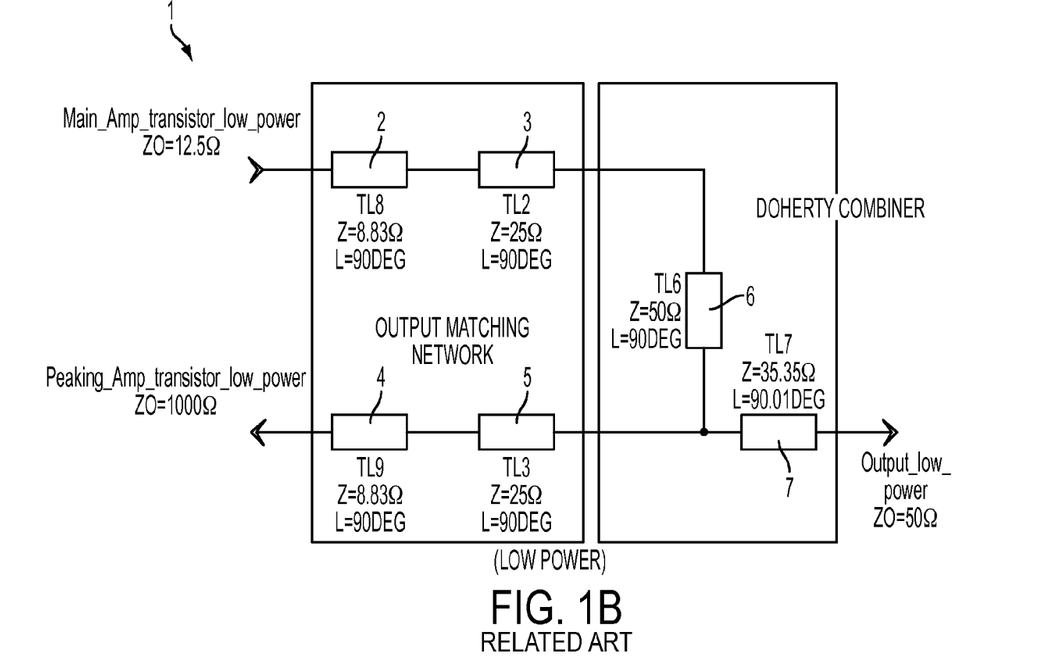

In reference to FIGS. 1A-1B, a conventional Doherty architecture is depicted. In this example, a 2 GHz amplifier that employs a typical high power GaN transistor having an optimum output matching impedance of 6.25 ohms is depicted. An output matching network is included in the schematic such that overall system bandwidth can be demonstrated. The carrier amplifier is coupled to transmission line 1 and transmission line 2 which are disposed in series. The peaking amplifier is coupled to transmission line 4 and transmission line 5, which are also disposed in series. The phase delay of matching networks has to be two quarter wavelength to achieve required Doherty operation. The Doherty combiner therefore includes two quarter wavelength transmission lines 6 and 7. For illustration purposes, only the practical transistor parasitic are ignored, and the matching networks are simplified to a quarter wave length equivalent counterpart. FIG. 1A shows the convention Doherty architecture during a maximum output power condition, i.e., when both the carrier and the peak amplifiers are in saturation. FIG. 1B shows the architecture in a low power condition wherein the carrier amplifier is operating, but not the peak power amplifier. Thus, the output impedance of the peak amplifier is set a high value (1,000 Ohms).

Figure 2:
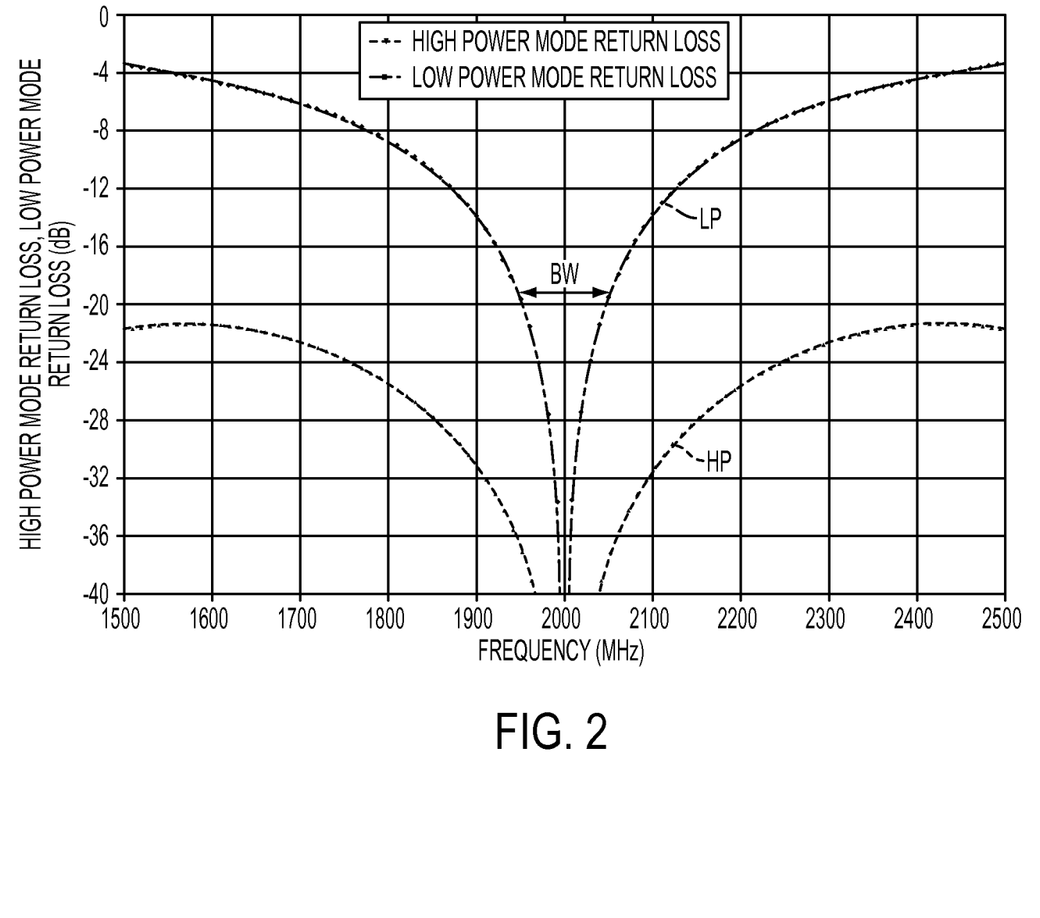
FIG. 2 is a chart illustrating the performance of the Doherty architecture depicted in FIGS. 1A-1B.

FIG. 2 is a chart that illustrates the performance of the conventional architecture by showing the bandwidth as a function of return loss at the combining port during the high power condition and the low power condition. In this example, the bandwidth is defined as less than −20 dB return loss. In the lower power mode (when peaking amplifier transistor is OFF and presents high impedance), the return loss of the conventional Doherty architecture only has the requisite bandwidth between 1950 MHz −2050 MHz, i.e., the bandwidth is approximately 100 MHz at 2000 MHz. It shows that the bandwidth limitation is at low power mode. Stated differently, the desired load pull up for main amplifier transistor is only achieved at very narrow frequency band. The conventional Doherty power amplifier is thus inherently narrowband, and is unable to span more than a single band. The bandwidth limitation is due to the combination of transistor technology, matching networks and Doherty combining circuits.

In another approach, an inverted Doherty architecture has been considered. In the inverted scheme, the in-phase signal path includes the peak amplifier and the quadrature signal path includes the carrier amplifier. The Doherty combiner includes a quarter length) (90° phase delay element that has a characteristic impedance that is equal to the load impedance (i.e., $Z_c = Z_L$). The delay element and the quadrature signal phase are summed at the combiner node. A second quarter length (90°) phase delay element is disposed between the combiner node and the load; this delay element has a characteristic impedance that is less than the load impedance. The advantage of this scheme is that a 90° transmission lines in the output matching network (for both the in-phase and quadrature paths) is eliminated while maintaining efficiency. The drawback of this approach, is that in the conventional inverted Doherty architecture, the output matching networks are typically designed to transform from transistor impedance directly to load impedance. The impedance transforming ratio is quite very large at this step and bandwidth is limited here by the matching network.

In yet another approach, another inverted Doherty architecture was considered. This scheme is similar to the inverted Doherty approach outlined above, with the exception that the characteristic impedance of the quarter length (90°) phase delay element coupled between the output matching network on the peak signal path and the combiner node is set to a value that is much greater than the load impedance. One significant drawback to this approach is that the carrier signal and the peak amplifier signal will not be efficiently combined at the system output.

Thus, there exists a need for a practical approach at system level that addresses the narrow bandwidth of the conventional Doherty type amplifier, as well as the drawbacks associated with the inverted Doherty configurations described above.

SUMMARY OF THE INVENTION

The present invention addresses the needs described above by providing a practical Doherty architecture that addresses the narrow bandwidth of the conventional Doherty type amplifier.

One aspect of the present invention is directed to a network that includes an output matching network coupled to an amplifier transistor that is characterized by at least one amplifier transistor output impedance. The output matching network includes an in-phase signal path disposed in parallel with a quadrature signal path. The output matching network is configured to transform the at least one amplifier transistor output impedance to an output matching network impedance. The output matching network impedance is intermediate the at least one amplifier transistor output impedance and a load impedance. A combiner network is coupled to the output matching network. The combiner network includes a first quarter wavelength transmission line coupled between the in-phase signal path and a combiner node. The first quarter wavelength transmission line is configured to substantially eliminate a phase delay between an in-phase signal and a quadrature signal. The combiner network further includes a bandwidth enhancement element coupled to the quadrature signal path at the combiner node and an impedance transformation element coupled between the combiner node and a load. The impedance transformation element is configured to substantially transform a combined output matching network impedance at the combiner node to the load impedance.

In another aspect, the invention is directed to a Doherty combiner network that includes a quarter wavelength transmission line coupled between an in-phase signal path and a combiner node. The quarter wavelength transmission line is configured to substantially eliminate a phase delay between an in-phase signal and a quadrature signal. A bandwidth enhancement element is coupled to a quadrature signal path at the combiner node. An impedance transformation element is coupled between the combiner node and a load. The impedance transformation element is configured to substantially transform a combined output matching network impedance at the combiner node to the load impedance.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principles and operation of the invention.

DETAILED DESCRIPTION

Reference will now be made in detail to the present exemplary embodiments of the invention, examples of which are illustrated in the accompanying drawings. Wherever possible, the same reference numbers will be used throughout the drawings to refer to the same or like parts. An exemplary embodiment of the Doherty architecture of the present invention is shown in FIGS. 3a-3B, and is designated generally throughout by reference numeral 10.

Figure 3A:
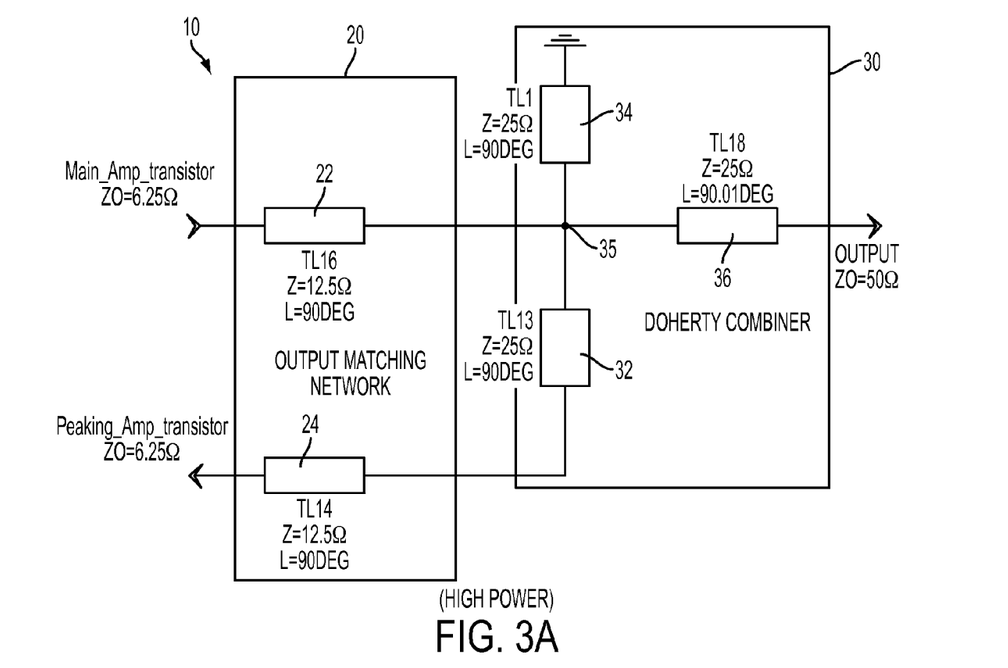
FIGS. 3A-3B are schematic diagrams of a Doherty architecture in accordance with a first embodiment of the present invention.
Figure 3B:
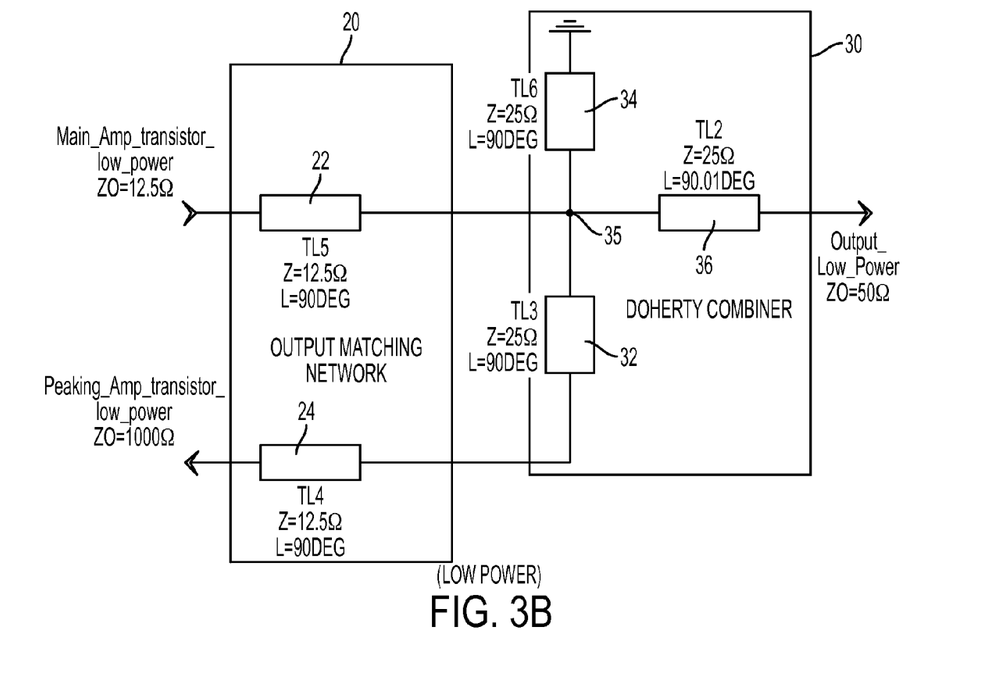

As embodied herein, and depicted in FIGS. 3A-3B, schematic diagrams of a Doherty network in accordance with a first embodiment of the present invention disclosed. The network 10 includes an output matching network 20 coupled to a Doherty combiner 30. The output matching network includes a quarter wave delay transmission line 22 coupled to a Doherty carrier amplifier (not shown); both of these elements are disposed in a quadrature signal path. The output matching network also includes a quarter wave delay transmission line 24 coupled to a Doherty peak amplifier (also not shown). Both of these elements are disposed in an in-phase signal path. The phase delay for each of the transmission lines (22, 24) in the matching network 20 has to be one quarter wave length to achieve the required Doherty operation. In the example embodiment of FIGS. 3A and 3B, the matching network 20 matches the carrier and peaking amplifiers to 25 ohms (instead of to the 50 ohm load).

The Doherty combiner includes a quarter wave phase delay transmission line 32 that is coupled between the in-phase signal path transmission line 24 and the combiner node 35. The first quarter wave phase delay transmission line is configured to substantially eliminate a phase delay between the in-phase signal and the quadrature signal. The combiner network further includes another quarter wave delay transmission line 34 that is coupled to the combiner node 35 and shunted to ground. The shunting transmission line 34 provides bandwidth enhancement by assisting Transmission line 36 to transform 12.5 to 50 ohm at off-center frequencies. The shunting transmission line 34 also improves linearity because is shorts signal even order harmonics to ground. As a result, even order harmonic products are not propagated. Because the shunting transmission line 34 substantially prevents even order harmonics from being propagated in the signal paths, little or no energy is expended, and thus efficiency is also improved. A third quarter wave transmission line 36 is disposed between the combiner node 35 and the load. Transmission line 36 is configured to substantially transform the combined output matching network impedance at the combiner node to the load impedance at the center frequency. In the example embodiment of FIGS. 3A-3B, the transmission line 36 functions as a 12.5 to 50 ohm impedance transformer at the center frequency (2.0 GHz). Thus, the combiner network 30 matches the system to a conventional 50 ohm load.

Figure 4:
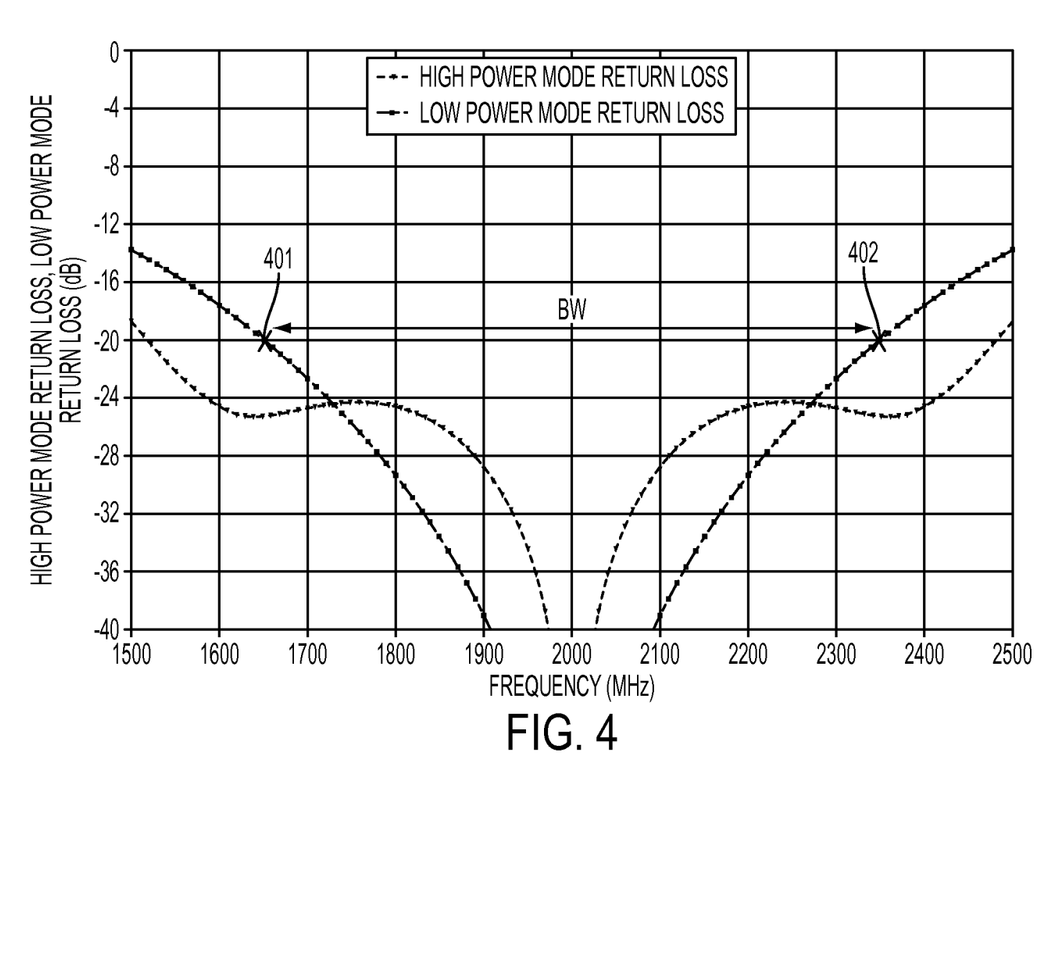
FIG. 4 is a chart illustrating the performance of the Doherty architecture depicted in FIGS. 3A-3B.

In reference to FIG. 4, a chart illustrating the performance of the Doherty network depicted in FIGS. 3A-3B is disclosed. As noted herein, the bandwidth is defined as the point where the return loss is less than 20 db. Reference is now made to FIG. 2 to illustrate the point more clearly. In the conventional Doherty system, bandwidth is an issue when the peak amplifier is OFF (low power mode). As shown in FIG. 2, the bandwidth is only 100 MHz and is thus not suitable for broad band applications. On the other hand, the embodiment of the present invention depicted in FIGS. 3A-3B shows significant improvement. A bandwidth (i.e., 20 dB return loss) of 700 MHz at 2000 MHz (i.e., between 1650 MHz –2350 MHz) is achieved by this network architecture.

Figure 5A:
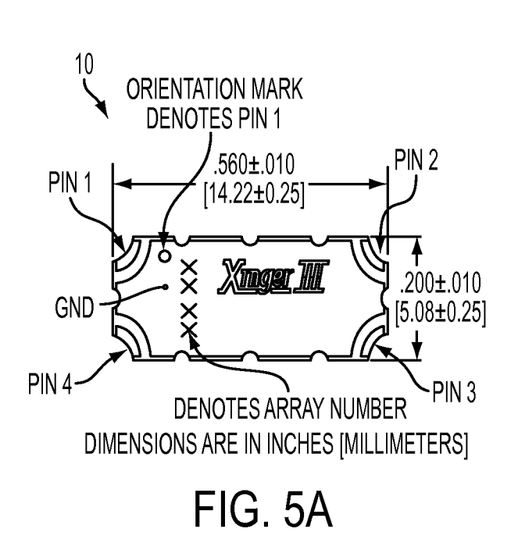
FIGS. 5A-5C are perspective views of an integrated RF circuit implementation of the Doherty architecture in accordance with a first embodiment of the present invention.
Figures 5B, 5C:
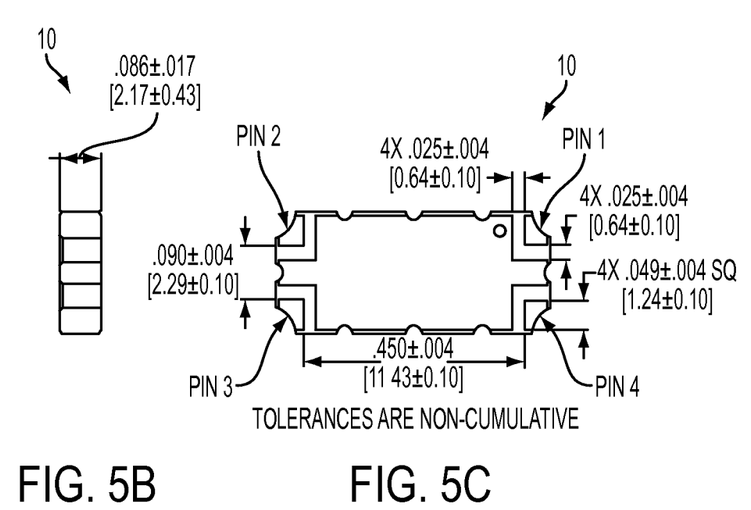

As embodied herein and depicted in FIGS. 5A-5C, perspective views of an integrated RF circuit implementation for the Doherty combiner 30 depicted in FIGS. 3A-3B is disclosed. FIG. 5A is a top view, FIG. 5B is a side view and FIG. 5C is a rear view of the device. The integrated circuit implementation 10 features a multi-layered device structure whereby each transmission line is vertically stacked. Pin 1 corresponds to the combiner port (reference element 35 in FIGS. 3A-3B). Pin 2 is configured to be coupled to ground. Pin 3 is configured to be coupled to the in-phase signal path (See, e.g., transmission line 22 coupled to the carrier amp in FIG. 3A). And pin 4 is configured to be coupled to the quadrature signal path (See, e.g., transmission line 24 coupled to the peak amp in FIG. 3A).

Figure 6A:
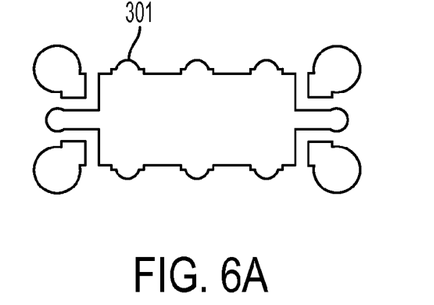
FIGS. 6A-6H are detail layer by layer views of the circuit implementation depicted in FIG. 5.
Figure 6B:
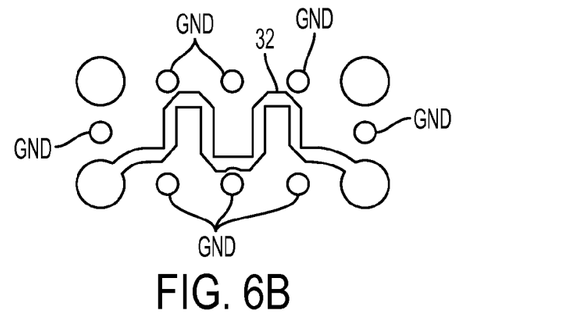
Figure 6C:
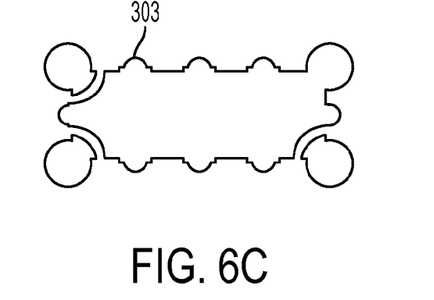
Figure 6D:
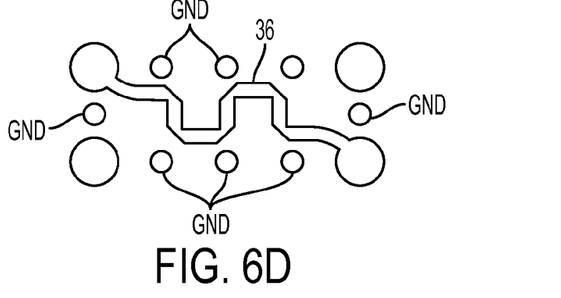
Figure 6E:
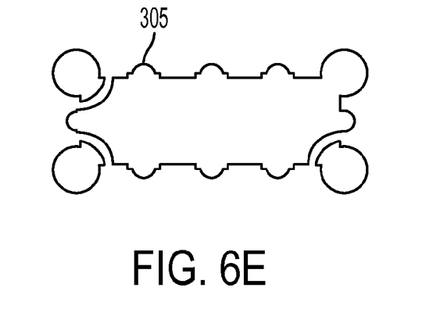
Figure 6F:
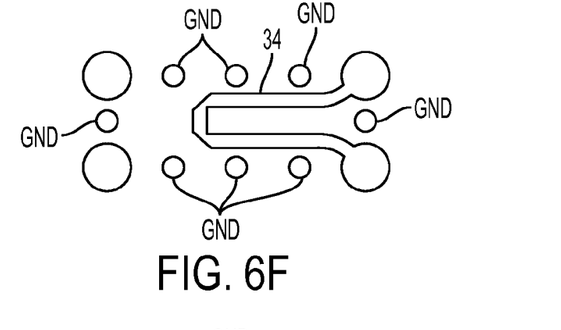
Figure 6G:
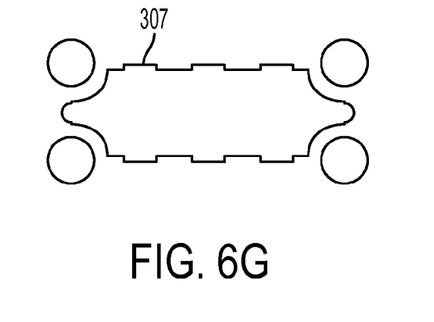
Figure 6H:
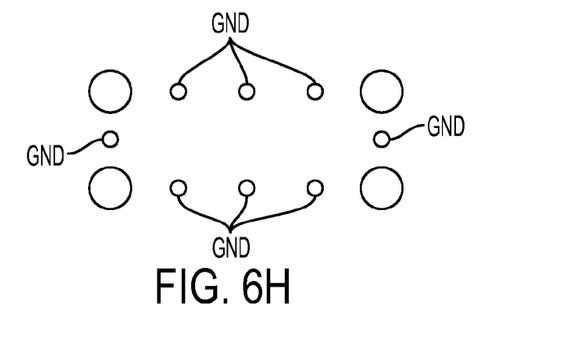

In reference to FIGS. 6A-6H, detail layer by layer views of the circuit implementation depicted in FIG. 5 are disclosed. FIG. 6A is a detail view of the first layer of the combiner circuit and shows the bottom ground plane and various mounting pads. FIG. 6B is a detail view of the second layer of the circuit which implements the transmission line 32 (See, e.g., FIG. 3A). FIG. 6C is a detail view of the third layer of the circuit and includes an interior ground plane. Note that since the transmission line 32 is disposed between two ground planes, a stripline structure is implemented. FIG. 6D is a detail view of the fourth layer of the circuit and implements transmission line 36 (See, e.g., FIG. 3A). FIG. 6E is a detail view of the fifth layer of the circuit and includes yet another ground plane. Since the transmission line 36 is also disposed between two ground planes, it is a stripline transmission line. FIG. 6F is a detail view of the sixth layer of the circuit and implements transmission line 34. FIG. 6G is a detail view of the seventh layer of the circuit and includes the top ground plane. Again, since the transmission line 34 is disposed between two ground planes, it is also a stripline transmission line. FIG. 6H is a detail view of the vertical vias. The smaller vias are ground connections that maintain the ground planes at the same potential. The larger diameter vias propagate the signals between the transmission line layers in the manner depicted in FIGS. 3A-3B. Those skilled in the art will understand that the stripline structures described above can be implemented using any suitable means including asymmetric, symmetric or microstripline techniques.

Figure 7A:
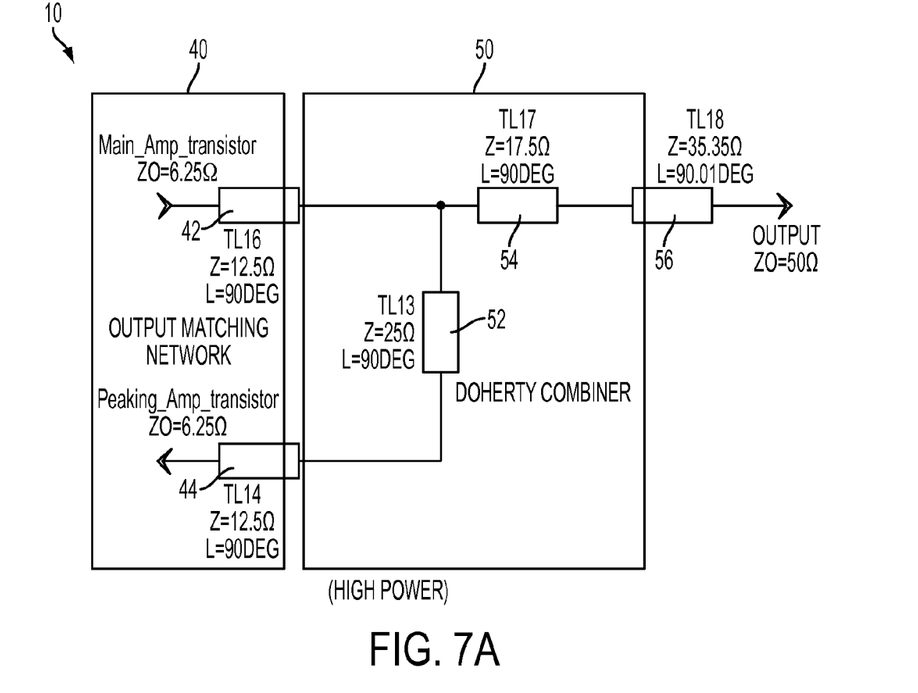
FIGS. 7A-7B are schematic diagrams of a Doherty architecture in accordance with a second embodiment of the present invention.
Figure 7B:
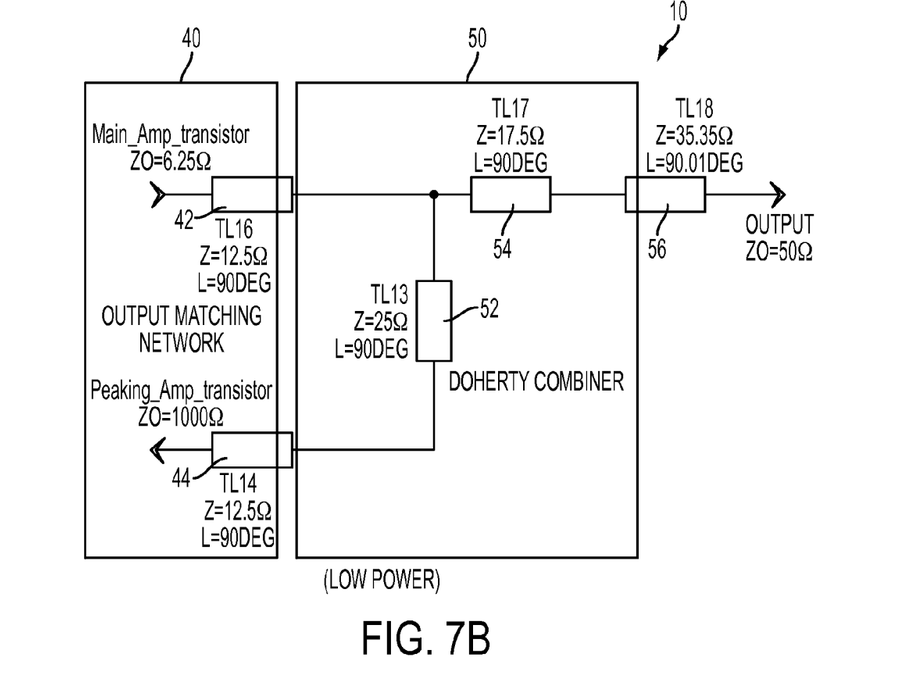

As embodied herein, and depicted in FIGS. 7A-7B, schematic diagrams of a Doherty architecture in accordance with a second embodiment of the present invention is disclosed. In this embodiment, the output matching network 20 is identical to the one depicted in FIG. 3A. Moreover, the combiner network is similar to the one depicted in FIG. 3A. The difference between the combiner network shown in FIGS. 3A-3B and the one depicted in this embodiment is that the 12.5 to 50 ohm impedance transformer (i.e., implemented by transmission lines 34 and 36 in FIGS. 3A-3B) is replaced by a two stage quarter wave length transformer (i.e., implemented by transmission lines 54 and 56 in FIGS. 7A-7B).

Figure 8:
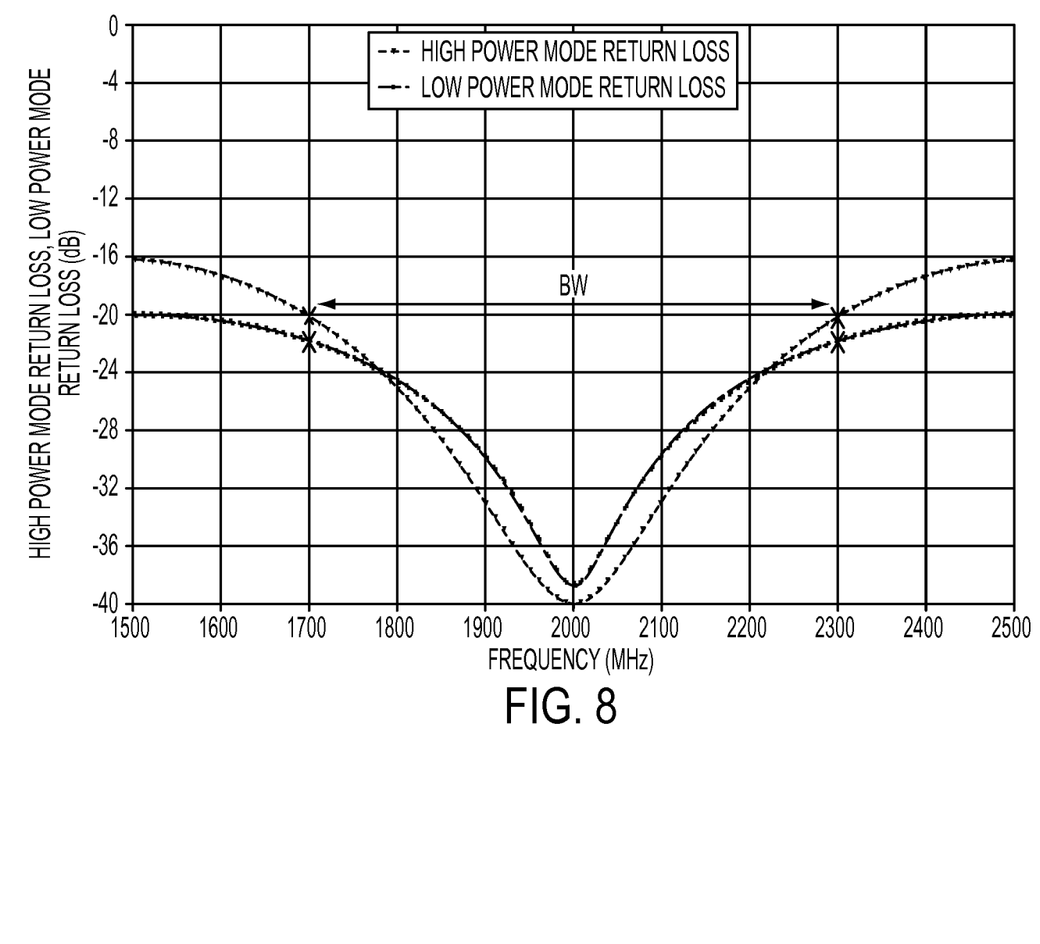
FIG. 8 is a chart illustrating the performance of the Doherty architecture depicted in FIGS. 7A-7B.

In reference to FIG. 8, a chart illustrating the performance of the Doherty architecture depicted in FIGS. 7A-7B is disclosed. This embodiment provides a 600 MHz bandwidth at 2.0 GHz (from 1700 MHz to 2300 MHz in the plot). While the performance of this embodiment is less than that achieved by the first embodiment, it is still a significant improvement vis à vis the conventional Doherty architectures described in the background of the invention.

All references, including publications, patent applications, and patent, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

What is claimed is:

1. A network comprising:
    an output matching network coupled to a Doherty amplifier including an amplifier transistor characterized by at least one amplifier transistor output impedance, the output matching network including an in-phase signal path disposed in parallel with a quadrature signal path, the Doherty amplifier including a carrier amplifier disposed in the quadrature signal path, and a peak amplifier disposed in the in-phase signal path, the output matching network being configured to transform the at least one amplifier transistor output impedance to an output matching network impedance, the output matching network impedance being intermediate the at least one amplifier transistor output impedance and a load impedance; and a combiner network coupled to the output matching network, the combiner network including a first quarter wavelength transmission line coupled between the in-phase signal path and a combiner node, the first quarter wavelength transmission line being configured to substantially eliminate a phase delay between an in-phase signal and a quadrature signal, the combiner network further including a bandwidth enhancement element coupled to the quadrature signal path at the combiner node, and an impedance transformation element coupled between the combiner node and a load, the impedance transformation element being configured to substantially transform a combined output matching network impedance at the combiner node to the load impedance.

2. The network of claim 1, wherein the bandwidth enhancement element is shunted to ground.

3. The network of claim 2, wherein the bandwidth enhancement element is a quarter wavelength transmission line coupled between the combiner node and ground.

4. The network of claim 3, wherein the bandwidth enhancement element is configured to improve linearity by substantially preventing propagation of even order harmonic products.

5. The network of claim 3, wherein the bandwidth enhancement element is configured to improve efficiency by substantially preventing even order harmonic signals from being supported in the combiner network.

6. The network of claim 2, wherein the bandwidth enhancement element is configured to assist in transforming the combined output matching network impedance to the load impedance at off-center frequencies to at least double the bandwidth relative to a Doherty network not including the bandwidth enhancement_element.

7. The network of claim 6, wherein the bandwidth enhancement element is configured to provide at least a seven-fold increase in the bandwidth relative to an inverted Doherty network not including the bandwidth enhancement element.

8. The network of claim 6, wherein the impedance transformation element is configured to substantially transform the combined output matching network impedance to the load impedance at a center frequency.

9. The network of claim 1, wherein the load impedance is substantially equal to about 50 Ohms.

10. The network of claim 9, wherein the combined output matching network impedance is substantially equal to about 25 Ohms.

11. The network of claim 10, wherein the combination of the bandwidth enhancement element and the impedance transformation element is configured to substantially transform the combined output matching network impedance to the load impedance.

12. The network of claim 11, wherein the bandwidth enhancement element and the impedance transformation element are quarter wavelength transmission lines.

13. The network of claim 1, wherein the bandwidth enhancement element is disposed between the combiner node and the impedance transformation element.

14. The network of claim 1, wherein the first quarter wavelength transmission line transforms in-phase signal path circuits to an open circuit at combiner node when the peak amplifier is OFF.

15. The network of claim 1, wherein the combiner network is disposed in a single integrated circuit package.

16. The network of claim 1, wherein the combiner network is configured as a multi-layered integrated circuit.

17. The network of claim 16, wherein the first quarter wavelength transmission line is configured as a stripline circuit element.

18. The network of claim 17, wherein the stripline circuit element may be implemented as an asymmetric stripline circuit element, a symmetric stripline circuit element or as a microstripline circuit element.

19. The network of claim 16, wherein the bandwidth enhancement element is configured as a stripline circuit element.

20. The network of claim 19, wherein the bandwidth enhancement element is a quarter wavelength transmission line.

21. The network of claim 19, wherein the stripline circuit element may be implemented as an asymmetric stripline circuit element, a symmetric stripline circuit element or as a microstripline circuit element.

22. The network of claim 16, wherein the impedance transformation element is configured as a symmetrical stripline circuit element.

23. The network of claim 22, wherein the impedance transformation element is a quarter wavelength transmission line.

24. The network of claim 22, wherein the stripline circuit element may be implemented as an asymmetric stripline circuit element, a symmetric stripline circuit element or as a microstripline circuit element.

25. A combiner network for a Doherty amplifier, the network comprising:
a quarter wavelength transmission line coupled between an in-phase signal path and a combiner node, the quarter wavelength transmission line being configured to substantially eliminate a phase delay between an in-phase signal and a quadrature signal, the Doherty amplifier including a carrier amplifier disposed in the quadrature signal path, and a peak amplifier disposed in the in-phase signal path;
a bandwidth enhancement element coupled to a quadrature signal path at the combiner node; and
an impedance transformation element coupled between the combiner node and a load, the impedance transformation element being configured to substantially transform a combined output matching network impedance at the combiner node to the load impedance.

26. The network of claim 25, wherein the bandwidth enhancement element is shunted to ground.

27. The network of claim 26, wherein the bandwidth enhancement element is a quarter wavelength transmission line coupled between the combiner node and ground.

28. The network of claim 27, wherein the bandwidth enhancement element is configured to improve linearity by substantially preventing propagation of even order harmonic products.

29. The network of claim 27, wherein the bandwidth enhancement element is configured to improve efficiency by substantially preventing even order harmonic signals from being supported in the combiner network.

30. The network of claim 26, wherein the bandwidth enhancement element is configured to assist in transforming the combined output matching network impedance to the load impedance at off-center frequencies to at least double the bandwidth relative to an inverted Doherty network not including the bandwidth enhancement element.

31. The network of claim 30, wherein the bandwidth enhancement element is configured to provide at least a seven-fold increase in the bandwidth relative to an inverted Doherty network not including the bandwidth enhancement element.

32. The network of claim 30, wherein the impedance transformation element is substantially configured to substantially transform the combined output matching network impedance to the load impedance at a center frequency.

33. The network of claim 25, wherein the load impedance is substantially equal to about 50 Ohms.

34. The network of claim 33, wherein the output matching network impedance is substantially equal to about 25 Ohms.

* * * * *